(12) United States Patent
Rhodes

(10) Patent No.: US 8,018,015 B2
(45) Date of Patent: Sep. 13, 2011

(54) BURIED CONDUCTOR FOR IMAGERS

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 100 days.

(21) Appl. No.: 11/168,760

(22) Filed: Jun. 29, 2005

(65) Prior Publication Data

US 2007/0001235 A1 Jan. 4, 2007

(51) Int. Cl.
*H01L 27/146* (2006.01)
*H01L 31/062* (2006.01)
*H01L 31/113* (2006.01)
*H01L 31/00* (2006.01)

(52) U.S. Cl. ........ 257/446; 257/292; 257/448; 257/459; 257/E27.133; 257/E31.115

(58) Field of Classification Search ................. None
See application file for complete search history.

(56) References Cited

U.S. PATENT DOCUMENTS

| | | | |
|---|---|---|---|
| 5,057,448 A | 10/1991 | Kuroda | |
| 5,070,038 A | 12/1991 | Jin | |
| 5,136,355 A | 8/1992 | Kerr et al. | |
| 5,528,081 A | 6/1996 | Hall | |
| 6,040,593 A * | 3/2000 | Park | 257/292 |
| 6,495,434 B1 | 12/2002 | Rhodes | |
| 6,642,087 B2 * | 11/2003 | Nozaki et al. | 438/149 |
| 6,867,438 B1 | 3/2005 | Maruyama et al. | |
| 7,005,689 B2 * | 2/2006 | Song et al. | 257/290 |
| 7,084,056 B2 * | 8/2006 | Won | 438/627 |
| 2001/0030332 A1 * | 10/2001 | Asada et al. | 257/225 |
| 2002/0019126 A1 | 2/2002 | Reinberg | |
| 2002/0079548 A1 | 6/2002 | Hu | |
| 2004/0169127 A1 * | 9/2004 | Ohkawa | 250/214.1 |
| 2004/0188597 A1 * | 9/2004 | Inoue et al. | 250/214 R |
| 2005/0001318 A1 * | 1/2005 | Won | 257/751 |
| 2005/0067640 A1 * | 3/2005 | Ohkawa | 257/291 |
| 2005/0199922 A1 * | 9/2005 | Park | 257/292 |
| 2005/0274995 A1 * | 12/2005 | Park | 257/291 |

FOREIGN PATENT DOCUMENTS

EP 0 908 956 A1 4/1999

OTHER PUBLICATIONS

Chinese Office Action with English Language Translation dated Sep. 18, 2009.

* cited by examiner

*Primary Examiner* — Hoang-Quan Ho
(74) *Attorney, Agent, or Firm* — Thomas J. D'Amico

(57) ABSTRACT

A pixel cell having a photo-conversion device at a surface of a substrate and at least one contact area from which charge or a signal is output or received. A first insulating layer is located over the photo-conversion device and the at least one contact area. The pixel cell further includes at least one conductor in contact with the at least one contact area. The conductor includes a polysilicon material extending through the first insulating layer and in contact with the at least one contact area. Further, a conductive material, which includes at least one of a silicide and a refractory metal, can be over and in contact with the polysilicon material.

20 Claims, 10 Drawing Sheets

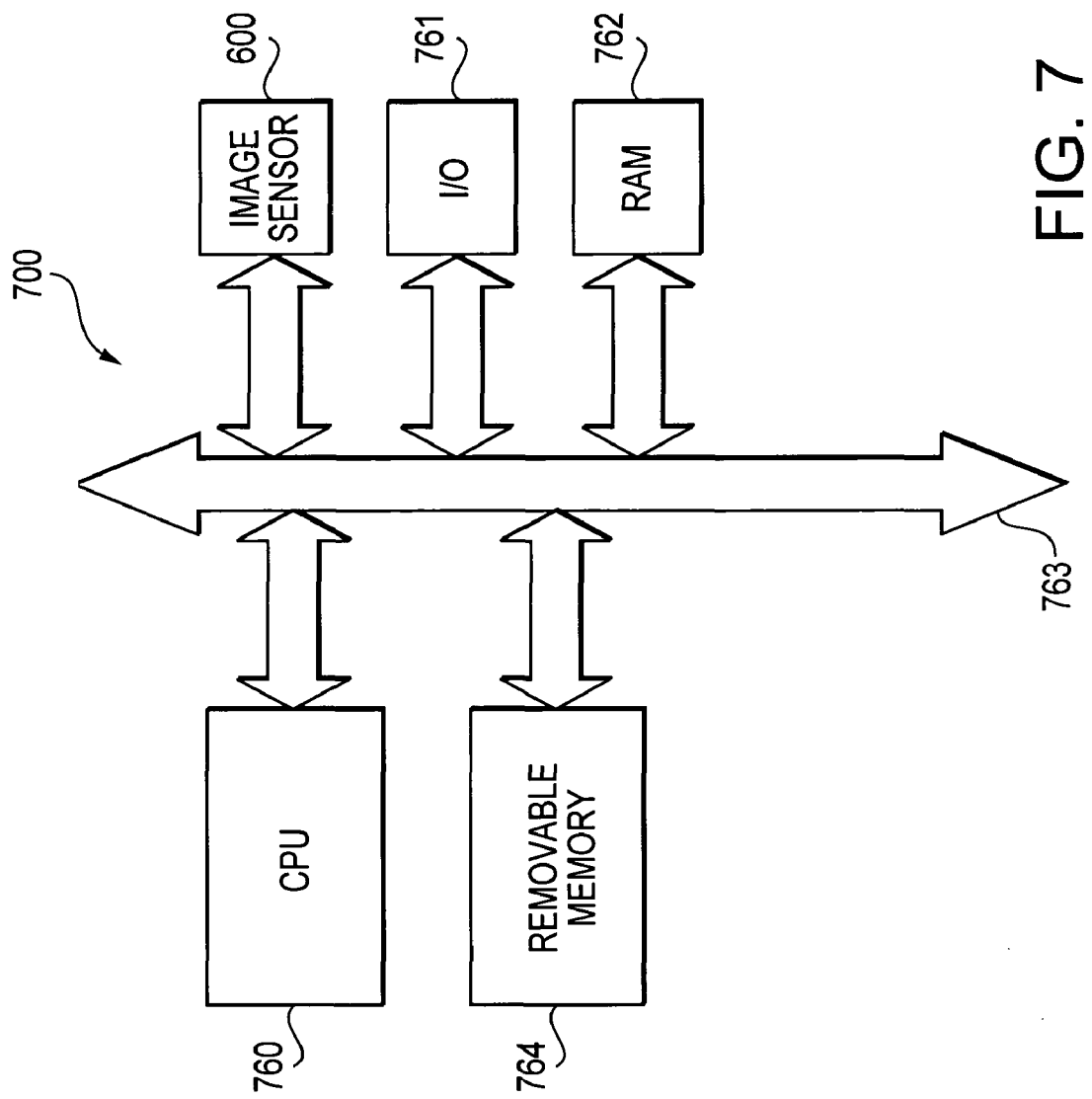

BURIED CONDUCTOR FOR IMAGERS

FIELD OF THE INVENTION

The present invention relates generally to the field of semiconductor devices and more particularly to improved conductors for use in image sensors.

BACKGROUND OF THE INVENTION

CMOS image sensors are increasingly being used as a low cost alternative to charge coupled device (CCD) image sensors. In a CMOS image sensor, the active elements of a pixel cell perform the necessary functions of: (1) photon to charge conversion; (2) accumulation of image charge; (3) transfer of charge to the sensing node accompanied by charge amplification; (4) resetting the sensing node to a known state before the transfer of charge to it; (5) selection of a pixel for readout; and (6) output and amplification of a signal representing pixel charge from the sensing node.

CMOS image sensors of the type discussed above are generally known as discussed, for example, in Nixon et al., "256×256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452-453 (1994). Exemplary CMOS image sensor circuits, processing steps thereof, and detailed descriptions of the functions of various CMOS elements of an image sensor circuit are described, for example, in U.S. Pat. Nos. 6,140,630, 6,376,868, 6,310,366, 6,326,652, 6,204,524, and 6,333,205, assigned to Micron Technology, Inc. The disclosures of each of the forgoing patents are herein incorporated by reference in their entirety.

FIG. 1A is schematic diagram of a conventional CMOS pixel cell 1, which includes conventional pixel cells 10. FIG. 1B shows a top plan view of a pixel cell 10 of FIG. 1A, while FIG. 1C shows a cross-sectional view of the pixel cell 10 of FIG. 1B along line 1C-1C'. Typically, the pixel cells 10 are formed at a surface of a substrate 11 (FIG. 1C). A pixel cell 10 is isolated from other pixel cells 10 and peripheral circuitry (not shown) by an isolation region 12 (FIG. 1C), which is shown as a shallow trench isolation (STI) region. The substrate 11 is doped to a first conductivity type, e.g., p-type and is biased at a ground potential.

As is known in the art, a pixel cell 10 functions by receiving photons of light and converting those photons into charge carried by electrons. For this, each one of the pixel cells 10 includes a photo-conversion device 21, which is shown as a pinned photodiode, but can be a non-pinned photodiode, photogate, photoconductor, or other photosensitive device. The photodiode 21 includes an n-type photodiode charge accumulation region 22 and a p-type surface layer 23 (FIG. 1C).

Each pixel cell 10 also includes a transfer transistor 27, which receives a transfer control signal TX at its gate electrode 30b. The transfer transistor 27 is connected to the photodiode 21 and a floating diffusion region 25. During operation, the TX signal operates the transfer transistor 27 to transfer charge from the photodiode charge accumulation region 22 to the floating diffusion region 25.

The pixel cell 10 further includes a reset transistor 28, which receives a reset control signal RST at its gate electrode 30b. The reset transistor 28 is connected to the floating diffusion region 25 and includes a source/drain region 60 coupled to a voltage supply, Vaa-pix, through a contact 61. In response to the RST signal, the reset transistor 28 operates to reset the diffusion region 25 to a predetermined charge level Vaa-pix.

A source follower transistor 29 has a gate electrode 30b coupled to the floating diffusion region 25 through a contact 61 that receives and amplifies a charge level from the diffusion region 25. The source follower transistor 29 also includes a first source/drain region 60 coupled to the power supply voltage, Vaa-pix, and a second source/drain region 60 connected to a row select transistor 26. The row select transistor 26 receives a row select control signal ROW_SEL at its gate electrode 30b. In response to the ROW_SEL signal, the row select transistor 26 couples the pixel cell 10 to a column line 22, which is coupled to a source/drain region 60 of the row select transistor 26. When the row select gate electrode 30b is operated, an output voltage is output from the pixel cell 20 through the column line 22.

As shown in FIG. 1C, the transistor gates 30b are part of gate stacks 30. Although, FIG. 1C shows only the transfer transistor 27 and reset transistor 28 having gate stacks 30, the source follower transistor 29 and the row select transistor 26 also include respective gate stacks 30. The gate stacks 30 generally include a first insulating layer 30a, which serves as the gate oxide layer. A layer of conductive material 30b, which serves as the gate electrode, is deposited over the first insulating layer 30a. A gate stack insulating layer 30c is deposited over the gate electrode 30b. Additionally, the gate stacks 30 can include layers of high conductivity material between the gate electrode 30b and the gate stack insulating layer 30c, such as a silicide layer or a barrier layer and a refractory metal layer. Dark current, however, can increase dramatically when such highly conductive materials are included in the gate stacks 30 of a pixel cell 10.

It is desirable to have a pixel cell including low resistance conductors that would not result in increased dark current.

BRIEF SUMMARY OF THE INVENTION

Exemplary embodiments of the invention provide a pixel cell having a photo-conversion device at a surface of a substrate and at least one contact area from which charge or a signal is output or received. A first insulating layer is located over the photo-conversion device and the at least one contact area. The pixel cell further includes at least one conductor in contact with the at least one contact area. The conductor includes a polysilicon material extending through the first insulating layer and in contact with the at least one contact area. Also, a conductive material, which includes at least one of a silicide and a refractory metal, can be and in contact with the polysilicon material.

BRIEF DESCRIPTION OF THE DRAWINGS

The foregoing and other advantages and features of the invention will become more apparent from the detailed description of exemplary embodiments provided below with reference to the accompanying drawings in which:

FIG. 7 is a block diagram of a processor system including the CMOS image sensor of FIG. 6.

DETAILED DESCRIPTION OF THE INVENTION

Figure 1A:
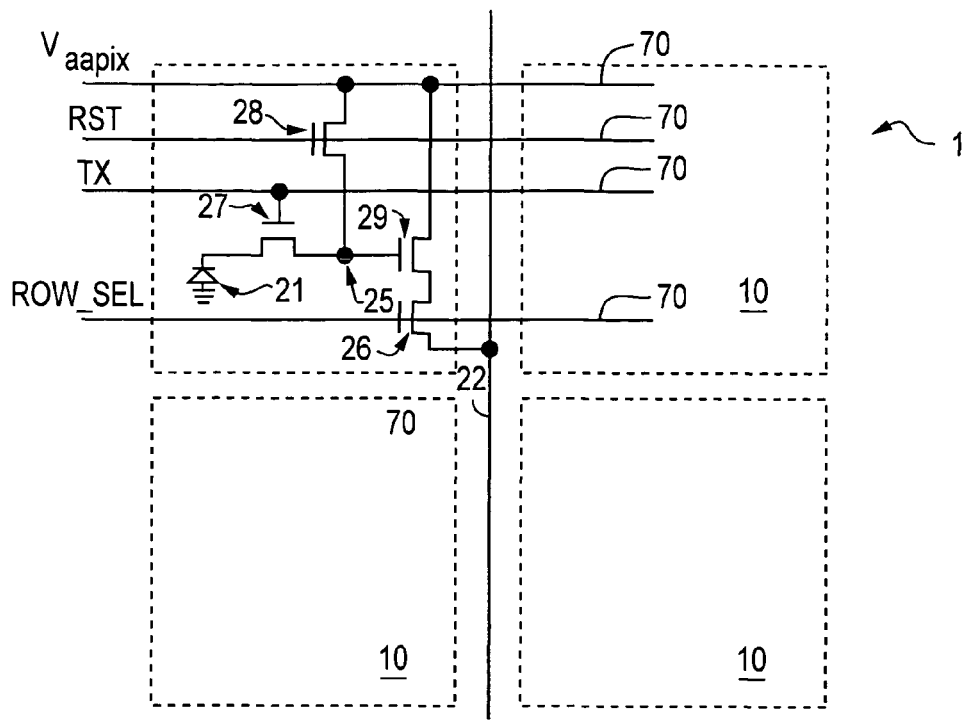
FIG. 1A is a schematic diagram of conventional CMOS pixel cells.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" or "pixel cell" refers to a picture element unit cell containing a photo-conversion device for converting electromagnetic radiation to an electrical signal.

Figure 1B:
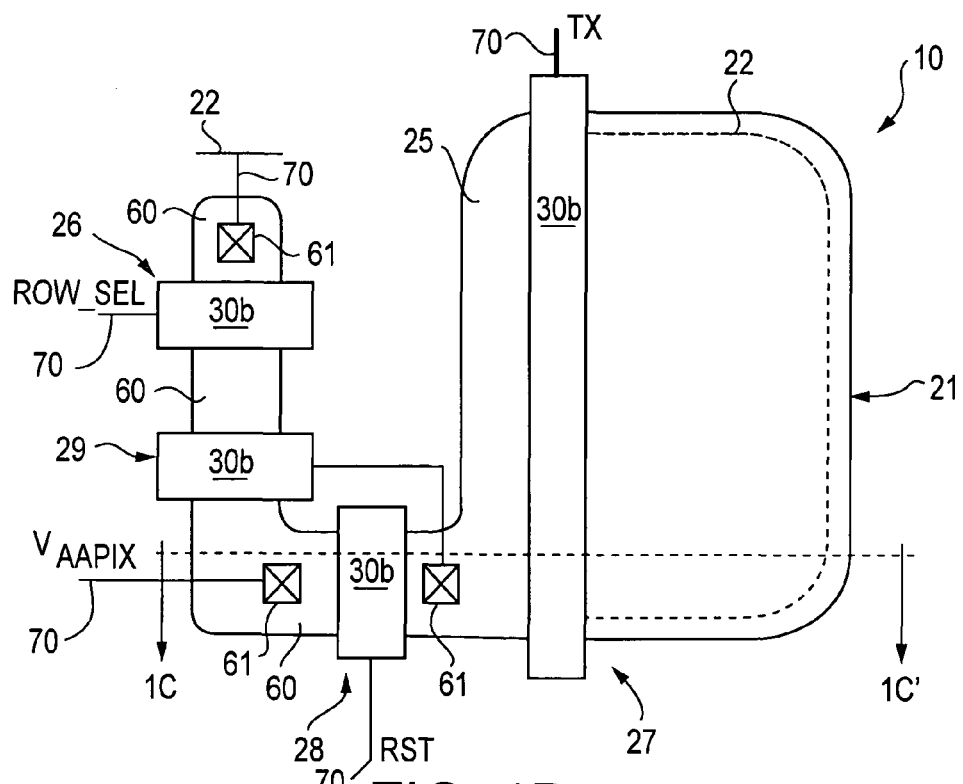
FIG. 1B is a top plan view of a pixel cell of FIG. 1A.
Figure 1C:
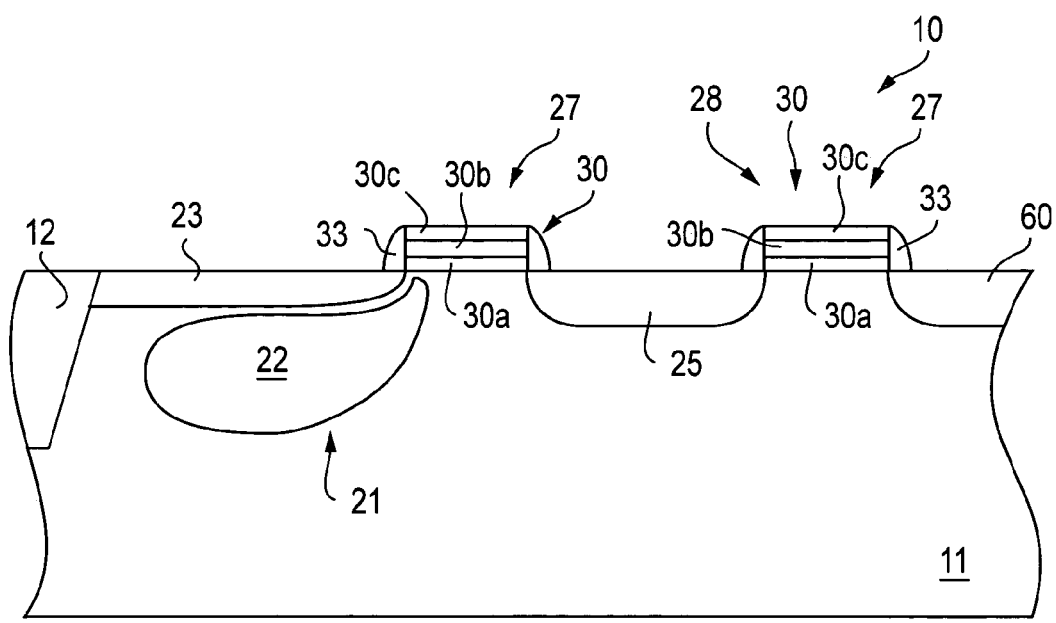
FIG. 1C is a cross-sectional view of the pixel cell of FIG. 1B taken along the line 1C-1C'.
Figure 2:
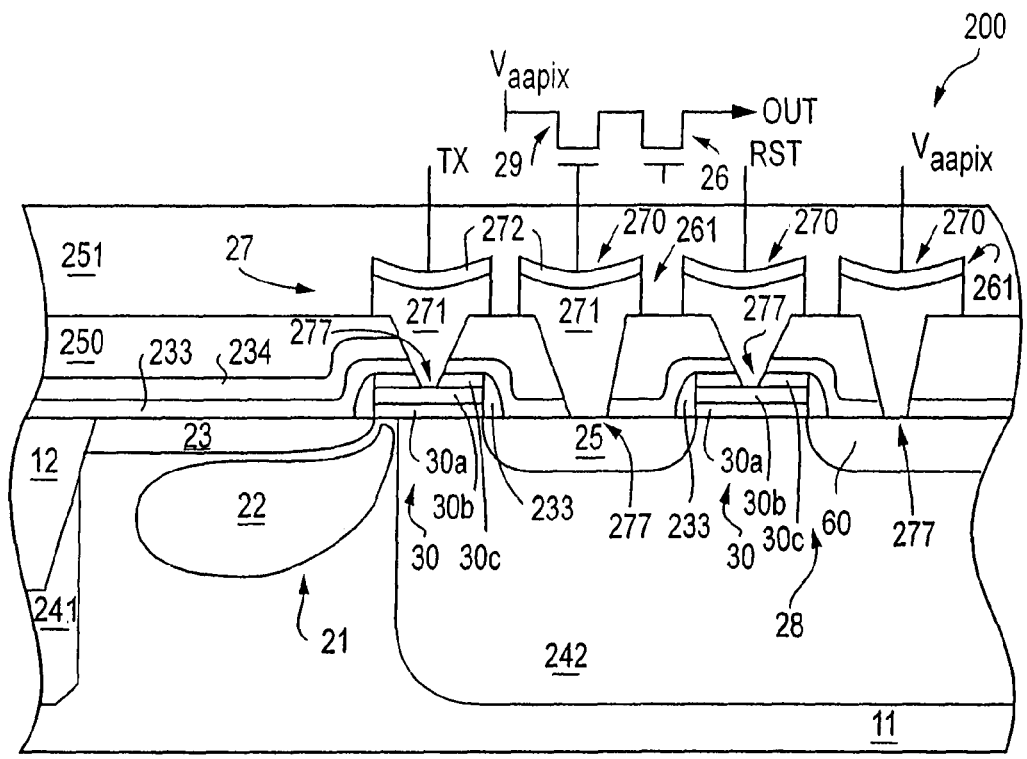
FIG. 2 is a cross-sectional view of a pixel cell according to an exemplary embodiment of the invention.

Referring to the drawings, FIG. 2 depicts a cross-sectional view of a pixel cell 200 according to an exemplary embodiment of the invention. The pixel cell 200 is similar to the pixel cell 10 depicted in FIGS. 1A-1C, except that the pixel cell 200 includes low resistance (i.e., high conductivity) conductors 270. Also, the pixel cell 200 may include a p-type well 241 surrounding and below the isolation region 12 and a p-type well 242 below the floating diffusion region 25, the reset transistor 28, and a portion of the transfer transistor 27. Further, as shown in FIG. 2, first, second, third, and fourth insulating layers 233, 234, 250, 251, respectively, are formed over the substrate 11 and the gate stacks 30. Portions of the first insulating layer 233 form sidewall spacers on the gate stacks 30.

The conductors 270 are in contact with conductive areas 277 from which charge or a signal can be output and/or received. Thus, conductors 270 can serve to route various lines 70 (e.g., row lines, output signal lines, power supply lines, and/or periphery circuitry) to the pixel cell 200. FIG. 2 depicts conductors 270 in contact with the gate electrodes 30b of the transfer transistor 27 and the reset transistor 28, the floating diffusion region 25, and a source/drain region 60 of the reset transistor 28. The conductors 270 include first and second conductive layers 271, 272, respectively. The first and second conductive layers 271, 272 are formed through the second and third insulating layers 234, 250. For the conductors 270 in contact with a gate electrode 30b, the first conductive layer 271 also extends through the gate stack insulating layer 30c.

Preferably, the first conductive layer 271 is a layer of polysilicon. The second conductive layer 272 is formed over the first conductive layer 271. The second conductive layer 272 can be a layer of a single material or a composite layer comprising layers of more than one material. For example, the second conductive layer 272 can be a silicide layer, such as tungsten silicide, titanium silicide, tungsten silicide, cobalt silicide, molybdenum silicide, or tantalum silicide, among others; or a barrier metal/refractory metal layer, such as tungsten nitride ($WN_x$)/tungsten, titanium nitride/tungsten (TiN/W), among others.

As described in more detail below, the conductors 270 are formed after the photodiode 21 and the first several insulating layers 233, 234, and 250 are formed. Therefore, the photodiode 21 is protected by the insulating layers 233, 234, and 250 when the conductors 270 are formed. In this manner, dark current is not increased by the formation of the conductors 270.

FIGS. 3A-3I depict the formation of pixel cell 200 according to an exemplary embodiment of the invention. No particular order is required for any of the actions described herein, except for those logically requiring the results of prior actions. Accordingly, while the actions below are described as being performed in a general order, the order is exemplary only and can be altered if desired.

Figure 3A:
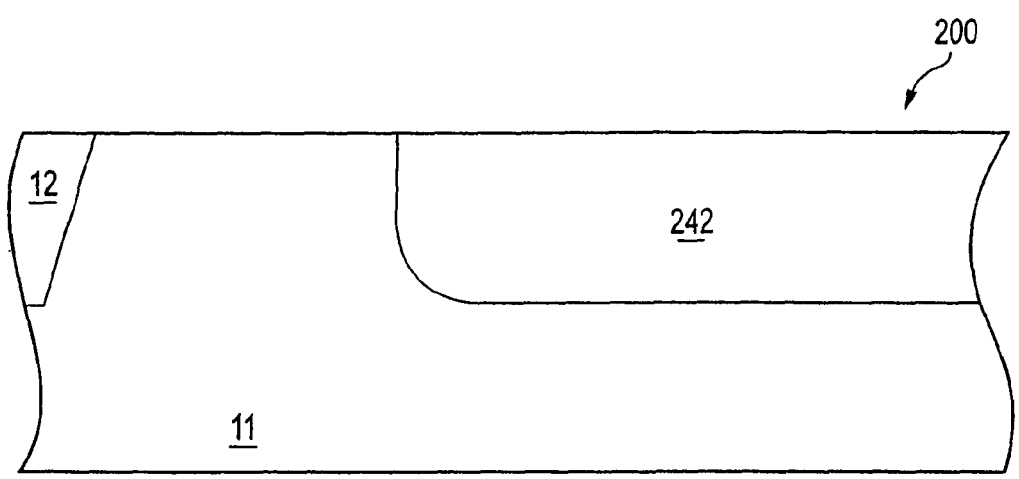
FIGS. 3A-3I depict the pixel cell of FIG. 2 at various stages of processing.

FIG. 3A illustrates a pixel cell 200 at an initial stage of fabrication. In the illustrated exemplary embodiment, the substrate 11 is a silicon substrate of a first conductivity type, which, for this exemplary embodiment is p-type. An isolation region 12 is formed in the substrate 11 and filled with an insulating material. The insulating material may be an oxide material, for example a silicon oxide; oxynitride; a nitride material, such as silicon nitride; silicon carbide; a high temperature polymer; or other suitable insulating material. As shown in FIG. 3A, the isolation region 12 can be a shallow trench isolation (STI) region. The insulating material for the STI region 12 is preferably a high density plasma (HDP) oxide, a material which has a high ability to effectively fill narrow trenches.

Doped p-type wells 241, 242 are implanted into the substrate 11 as also shown in FIG. 3A. The p-wells 241, 242 are formed in the substrate away from the area where the photodiode 21 (FIG. 2) is to be formed. The p-wells 241, 242 can be shared with an adjacent pixel cell (not shown). The p-wells 241, 242 are formed by any known method. For example, a layer of photoresist (not shown) can be patterned over the substrate 11 having an opening over the area where the p-wells 241, 242 are to be formed. A p-type dopant, such as boron, can be implanted into the substrate 11 through the opening in the photoresist. The p-wells 241, 242 are formed having a p-type dopant concentration that is higher than adjacent portions of the substrate 11.

Figure 3B:
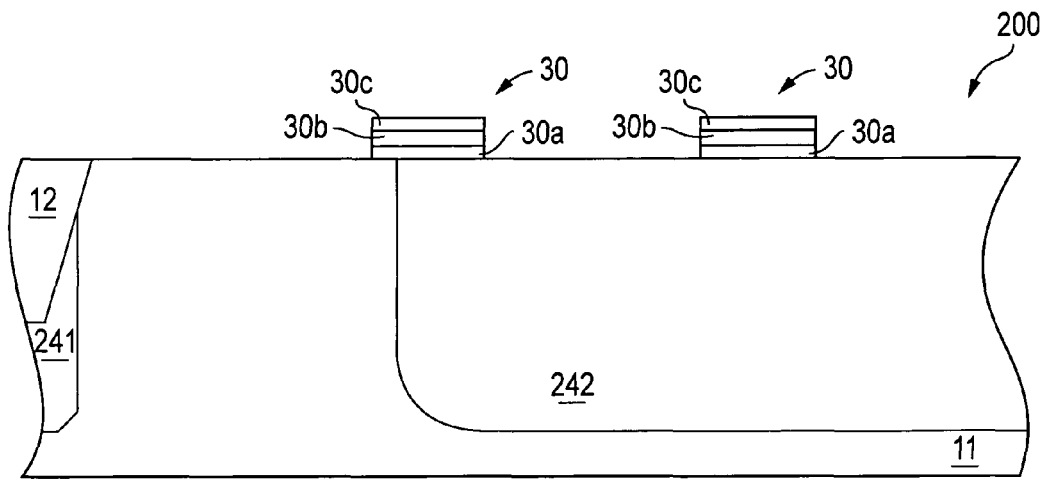

FIG. 3B depicts the formation of the transfer transistor 27 (FIG. 2) and the reset transistor 28 (FIG. 2) gate stacks 30. Although not shown, the source follower and row select transistors 29, 26 (FIGS. 1A and 1B), respectively, can be formed concurrently with the transfer and reset transistors 27, 28, as described below.

To form the gate stacks 30, a first insulating layer 30a of, for example, silicon oxide is grown or deposited on the substrate 11. The first insulating layer 30a serves as the gate oxide layer for the subsequently formed transistor gate electrode 30b. Next, a layer of conductive material 30b is deposited over the oxide layer 30a. The conductive layer 30b serves as the gate electrode for the transistors 27, 28 (FIG. 2). The gate electrode 30b may be a layer of polysilicon, which may be doped to a second conductivity type, e.g., n-type. A second insulating layer 30c, referred to herein as the gate stack insulating layer, is deposited over the gate electrode 30b. The gate stack insulating layer 30c may be formed of, for example, TEOS, a silicon oxide ($SiO_2$), a nitride (e.g., silicon nitride), an oxynitride (silicon oxynitride), ON (oxide-nitride), NO (nitride-oxide), or ONO (oxide-nitride-oxide).

The gate stack layers 30a, 30b, 30c may be formed by conventional methods, such as grown in a furnace, chemical vapor deposition (CVD) or plasma enhanced chemical vapor deposition (PECVD), among others. The layers 30a, 30b, 30c are then patterned and etched to form the multilayer gate stacks 30 shown in FIG. 3B.

The invention is not limited to the structure of the gate stacks 30 described above. Additional layers may be added or the gate stacks 30 may be altered as is desired and known in the art.

Figure 3C:
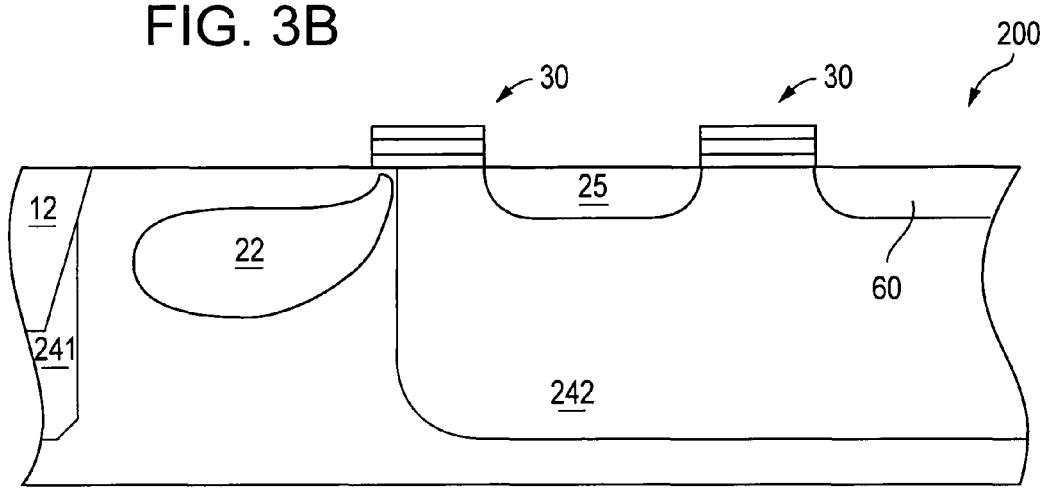

As depicted in FIG. 3C, a doped n-type region 22 is implanted in the substrate 11. For example, a layer of photoresist (not shown) may be patterned over the substrate 11 having an opening over the surface of the substrate 11 where photodiode 21 (FIG. 2) is to be formed. An n-type dopant, such as phosphorus, arsenic, or antimony, may be implanted through the opening and into the substrate 11. Multiple implants may be used to tailor the doping profile of region 22. If desired, an angled implantation may be conducted to form the doped region 22, such that implantation is carried out at angles other than 90 degrees relative to the surface of the substrate 11.

As shown in FIG. 3C, the n-type region 22 is formed from a point adjacent the transfer gate stack 30 and extending within the substrate 11 between the transfer gate stack 30 and the isolation region 12. The region 22 forms a photosensitive charge accumulating region for collecting photo-generated charge.

The floating diffusion region 25 and source/drain region 60 are implanted by known methods to achieve the structure shown in FIG. 3C. The floating diffusion region 25 and source/drain region 60 are formed as n-type regions. Any suitable n-type dopant, such as phosphorus, arsenic, or antimony, may be used. The floating diffusion region 25 is formed on the side of the transfer gate stack 30 opposite the n-type photodiode region 22. The source/drain region 60 is formed on a side of the reset gate stack 30 opposite the floating diffusion region 25.

Figure 3D:
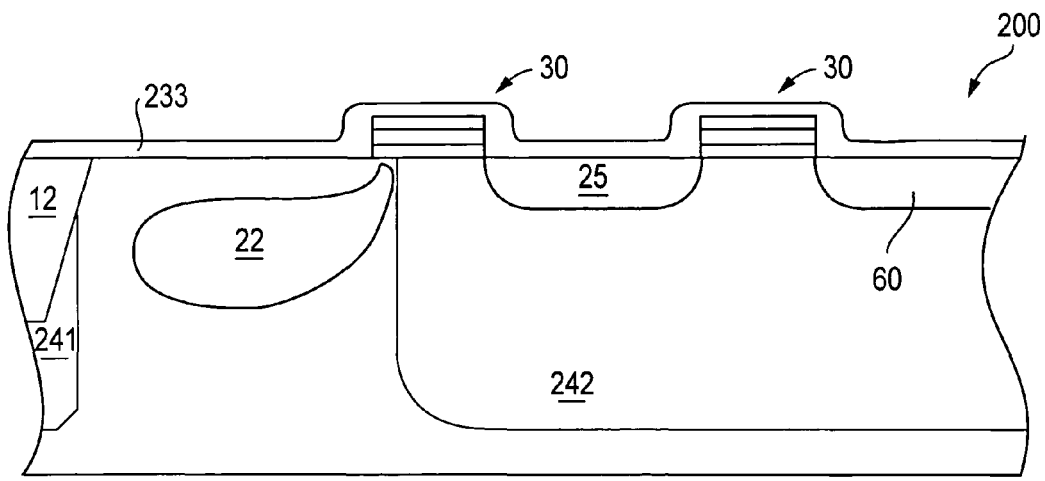

FIG. 3D depicts the formation of a first insulating layer 233. This layer 233 can be any appropriate insulating material, such as tetraethyl orthosilicate (TEOS), silicon dioxide, silicon nitride, an oxynitride, among others, formed by methods known in the art.

Figure 3E:
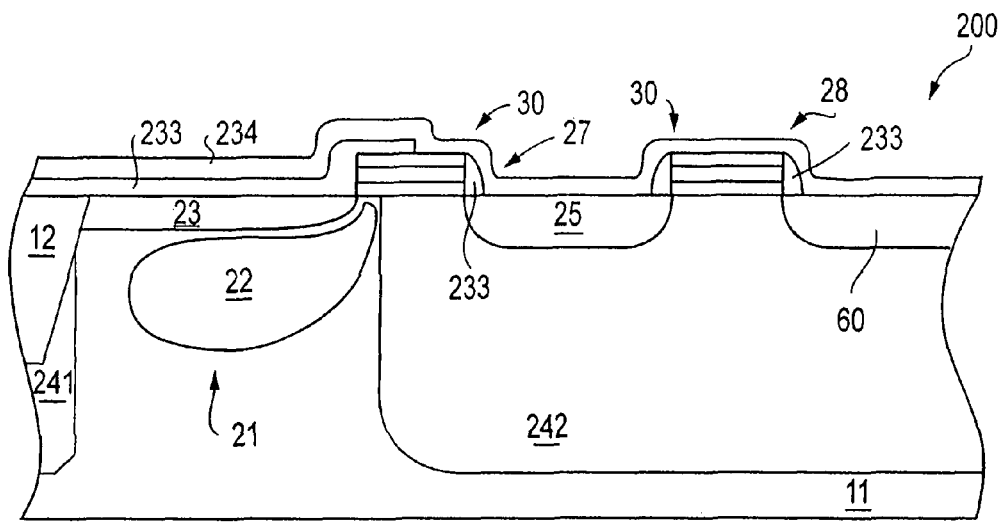

FIG. 3E illustrates the formation of the surface layer 23 within the substrate 11. In the illustrated embodiment, a p-type dopant, such as boron, indium, or any other suitable p-type dopant, may be used to form the p-type surface layer 23. Alternatively, if desired, the surface layer 23 can be formed before the n-type region 22 (FIG. 3C).

The first insulating layer 233 is etched as shown in FIG. 3E. The remaining portions of layer 233 form sidewall spacers on the sidewall of the reset gate stack 30 and a sidewall of the transfer gate stack 30. Layer 233 remains over a portion of the transfer gate stack 30 and the photodiode 21. Alternatively, the first insulating layer 233 can be patterned/etched such that only sidewall spacers (not shown) remain on the gate stacks 30.

Optionally, a second insulating layer 234 (e.g., a TEOS layer) can be formed over the first insulating layer 233 to achieve the structure shown in FIG. 3E.

Figure 3F:
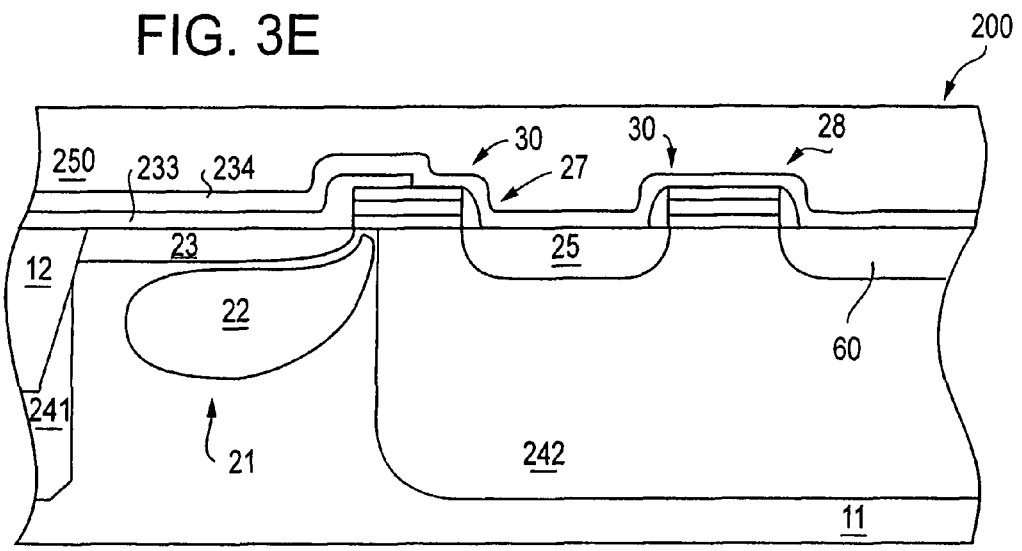

As depicted in FIG. 3F, a third insulating layer 250 is formed over the second insulating layer 234. In the embodiment of FIG. 3F, the third insulating layer 250 is a layer of borophosphosilicate glass (BPSG). Instead, the third insulating layer could be, for example, silicon dioxide, borosilicate glass (BSG), or phosphosilicate glass (PSG), among others. The third insulating layer 250 is planarized by, for example, a chemical mechanical polish (CMP) step.

Figure 3G:
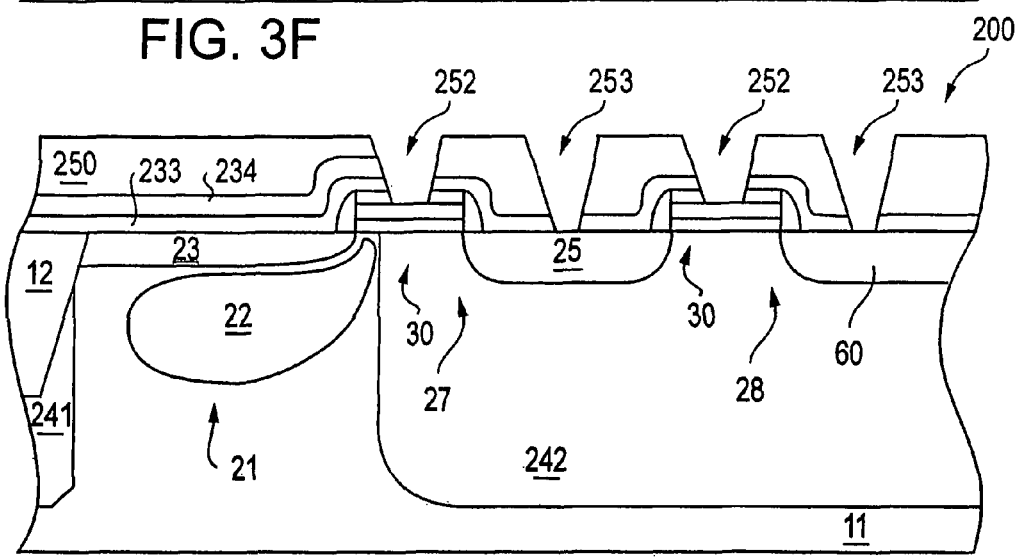

As shown in FIG. 3G, openings 252, 253 are formed in the second insulating layer 234 and the third insulating layer 250. The openings 252, 253 can be formed by any known technique. The openings 252 are formed to expose the gate electrodes 30b of the gate stacks 30. The openings 253 are formed to expose the floating diffusion region 25 and source/drain region 60.

Figure 3H:
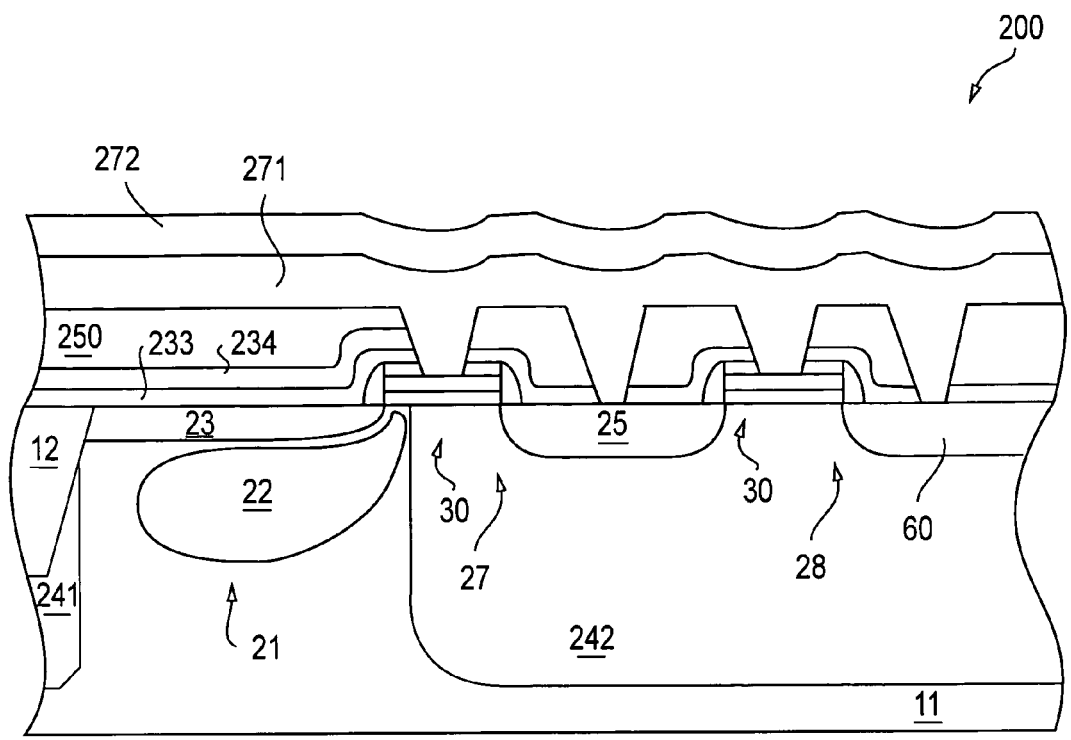

FIG. 3H depicts the formation of a first conductive layer 271 that fills the openings 252, 253. Preferably, the first conductive layer 271 is a layer of polysilicon. A second conductive layer 272 is formed over the first conductive layer 271. The second conductive layer 272 can be a layer of a single material or a composite layer comprising layers of more than one material. For example, the second conductive layer 272 can be a silicide layer, such as tungsten silicide, titanium silicide, cobalt silicide, molybdenum silicide, or tantalum silicide, among others; or a barrier metal/refractory metal layer, such as tungsten nitride ($WN_x$)/tungsten, titanium nitride/tungsten (TiN/W), among others. It should be noted that the second conductive layer 272 is not required for applications where low resistance is not needed.

Figure 3I:
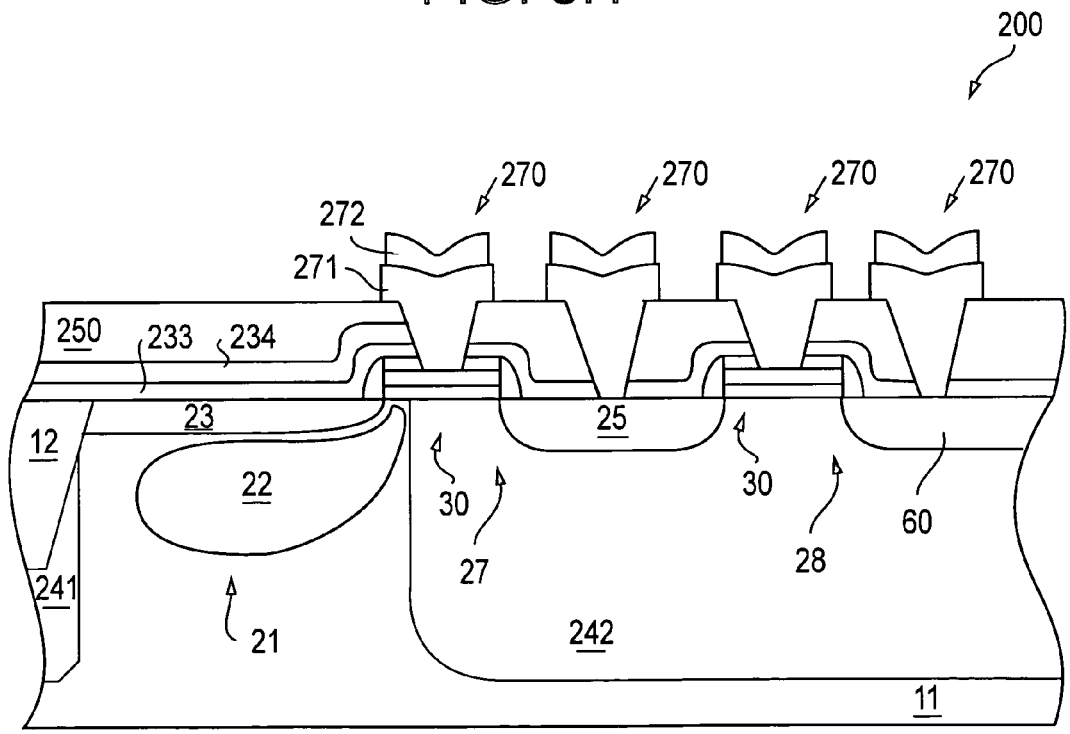

The first and second conductive layers 271, 272 are patterned to form the conductors 270, as shown in FIG. 3I. As noted above, dark current is not significantly increased by the formation of the conductors 270, since the photodiode 21 is protected when the conductors 270 are formed. In the illustrated embodiment, the photodiode 21 is protected by the first, second, and third insulating layers 233, 234, 250.

A fourth insulating layer 251 is formed over the conductors 270 and third insulating layer 250 to achieve the structure shown in FIG. 2. The fourth insulating layer 251 can be, for example, silicon dioxide, BSG, PSG, or BPSG. Conventional processing methods are used to form other structures (not shown) of the pixel 200. For example, shielding, and metallization layers to connect conductors 270 to row lines 70; and other connections of the pixel 200 are formed.

Figure 4:
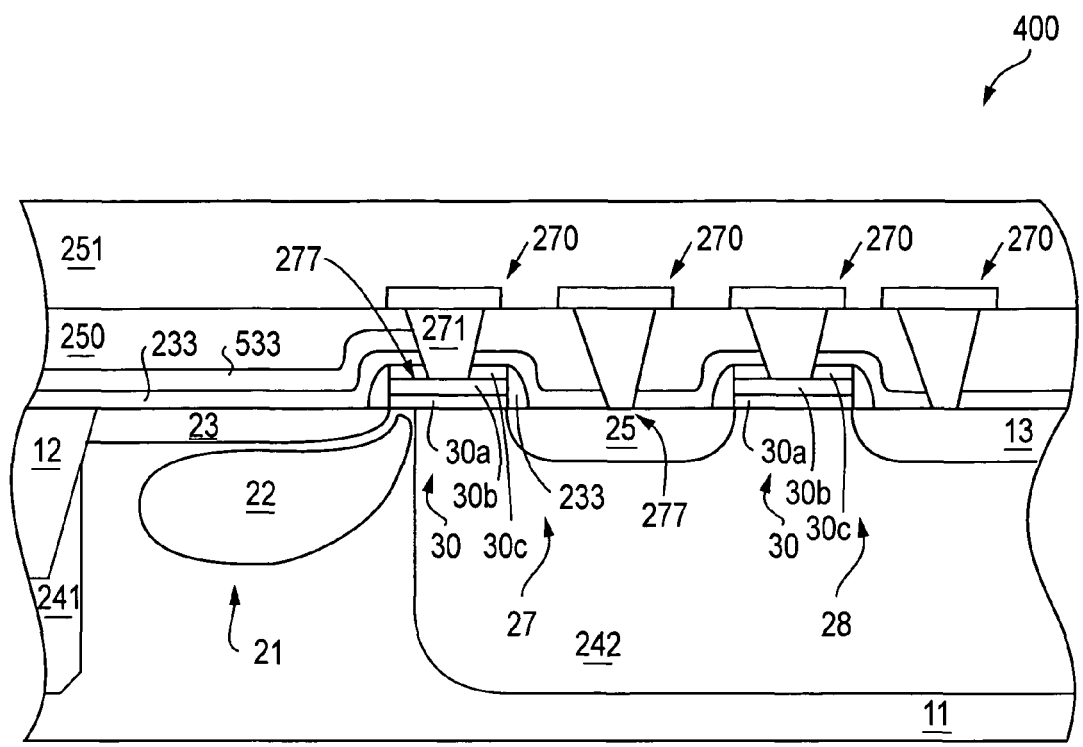
FIG. 4 is a cross-sectional view of a pixel cell according to another exemplary embodiment of the invention.

FIG. 4 is a cross-sectional view of a pixel cell 400 according to another exemplary embodiment of the invention. The pixel cell 400 is similar to pixel cell 200 (FIG. 2), except that the first conductive layer 271 is formed only within the third insulating layer 250. The pixel cell 400 can be formed as described above in connection with FIGS. 3A-3I, except that after the first conductive layer 271 is formed and before the second conductive layer is formed, the first conductive layer 271 is planarized by, for example, a chemical mechanical polish (CMP) step. Accordingly, only the second conductive layer 272 is patterned.

Additionally, in the FIG. 4 embodiment, the second conductive layer 272 can further include a polysilicon layer. Thus, the second conductive layer 272 can, for example, have a polysilicon/silicide or a polysilicon/barrier metal/refractory metal layering structure.

Figure 5:
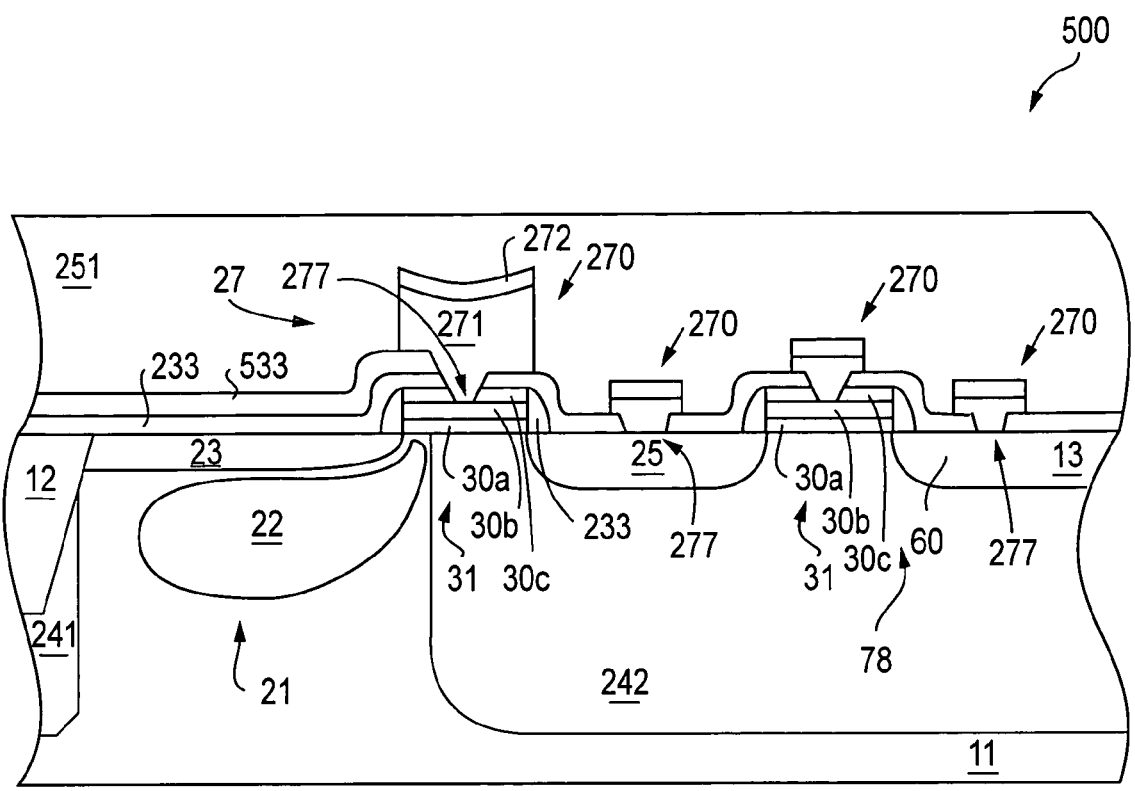
FIG. 5 is a cross-sectional view of a pixel cell according to another exemplary embodiment of the invention.

FIG. 5 is a cross-sectional view of a pixel cell 500 according to another exemplary embodiment of the invention. The pixel cell 500 is similar to the pixel cell 200 (FIG. 2), except that the third planarized insulating layer 250 is omitted. The pixel cell 500 can be formed as described above in connection with FIGS. 3A-3I, except that the step of forming the third planarized insulating layer 250 is omitted and the openings 252 are formed through the second insulating layer 234 and the gate insulating layer 30c; and the openings 253 are formed through the second insulating layer 234.

Although the above embodiments are described in connection with 4T pixel cell 200 (FIG. 2), 400 (FIG. 4), and 500 (FIG. 5), the configuration of the pixel cells 200, 400, 500 is only exemplary and the invention may also be incorporated into other pixel circuits having different numbers of transistors. Without being limiting, such a circuit may include a three-transistor (3T) pixel cell or a five (5T) or more transistor pixel cell. A 3T cell omits the transfer transistor, but may have a reset transistor adjacent to the photo-conversion device. The 5T, 6T, and 7T pixel cells differ from the 4T pixel cell by the addition of one, two, or three transistors, respectively, such as a shutter transistor, a CMOS photogate transistor, and an anti-blooming transistor. Further, while the above embodiments are described in connection with CMOS pixel cells 200, 400, 500, the invention is also applicable to pixel cells in a charge coupled device (CCD) image sensor.

Figure 6:
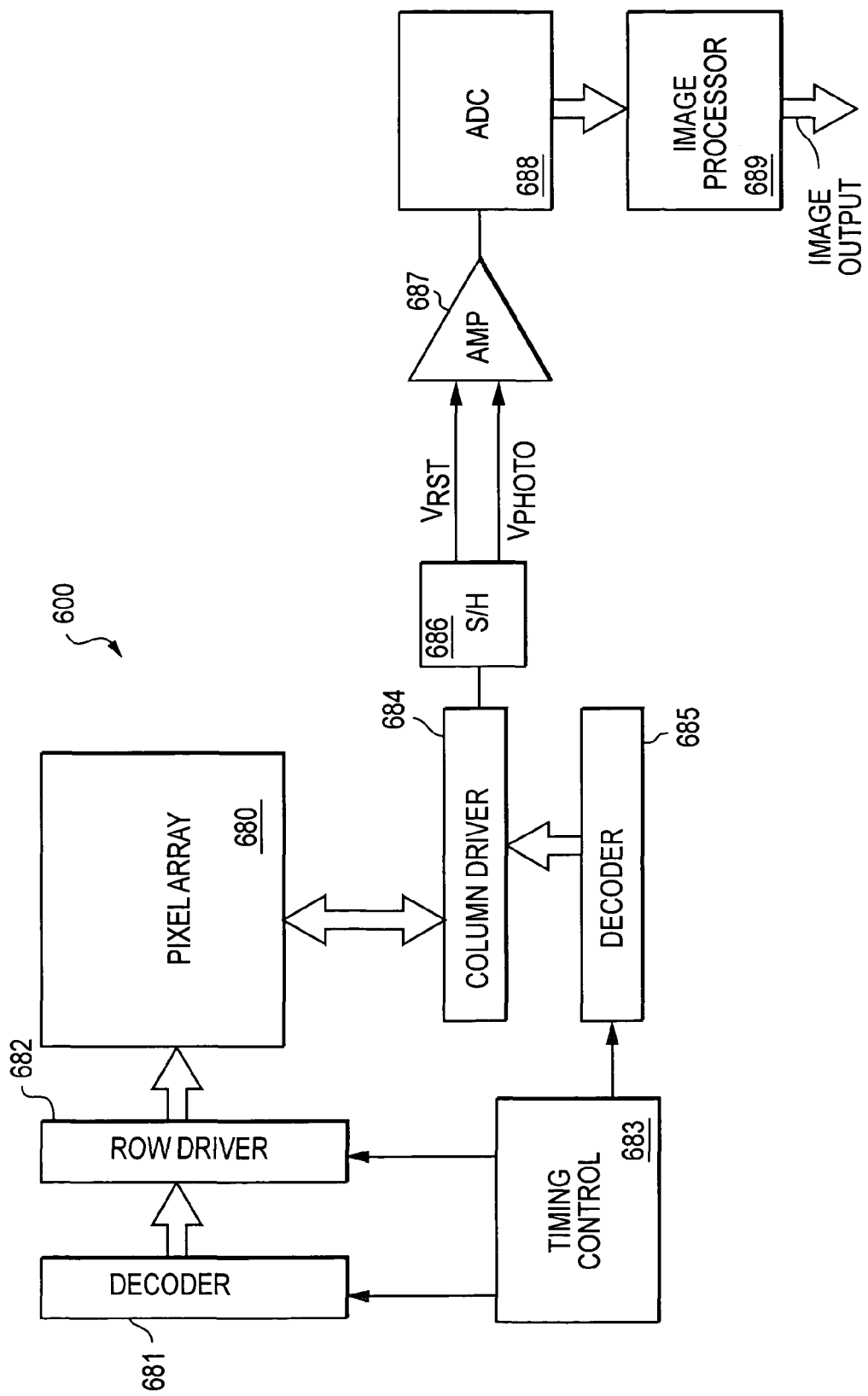
FIG. 6 is a block diagram of a CMOS image sensor according to an exemplary embodiment of the invention.

A typical single chip CMOS image sensor 600 is illustrated by the block diagram of FIG. 6. The image sensor 600 includes a pixel cell array 680 having one or more pixel cells, e.g., pixel cells 200 (FIG. 2) including low resistance conductors 270 as described above. The pixel cells of array 680 are arranged in a predetermined number of columns and rows. Alternatively, the pixel array 680 could include pixel cells 400 (FIG. 4) and/or 500 (FIG. 5).

In operation, the rows of pixel cells in array 680 are read out one by one. Accordingly, pixel cells in a row of array 680 are all selected for readout at the same time by a row select line, and each pixel cell in a selected row provides a signal representative of received light to a readout line for its column. In the array 680, each column also has a select line, and the pixel cells of each column are selectively read out in response to the column select lines.

The row lines in the array 680 are selectively activated by a row driver 682 in response to row address decoder 681. The column select lines are selectively activated by a column driver 684 in response to column address decoder 685. The array 680 is operated by the timing and control circuit 683, which controls address decoders 681, 685 for selecting the appropriate row and column lines for pixel signal readout.

The signals on the column readout lines typically include a pixel reset signal ($V_{rst}$) and a pixel image signal ($V_{photo}$) for each pixel cell. Both signals are read into a sample and hold circuit (S/H) 686 in response to the column driver 684. A differential signal ($V_{rst}-V_{photo}$) is produced by differential amplifier (AMP) 687 for each pixel cell, and each pixel cell's differential signal is digitized by analog-to-digital converter (ADC) 688. The analog-to-digital converter 688 supplies the digitized pixel signals to an image processor 689, which performs appropriate image processing before providing digital signals defining an image output.

FIG. 7 illustrates a processor system 700 including an image sensor 600 of FIG. 6. The processor system 700 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

The system 700, for example a camera system, generally comprises a central processing unit (CPU) 760, such as a microprocessor, that communicates with an input/output (I/O) device 761 over a bus 763. Image sensor 600 also communicates with the CPU 760 over bus 763. The system 700 also includes random access memory (RAM) 762, and can include removable memory 764, such as flash memory, which also communicate with CPU 760 over the bus 763. Image sensor 600 may be combined with a processor, such as a CPU, digital signal processor, or microprocessor, with or without memory storage on a single integrated circuit or on a different chip than the processor.

It is again noted that the above description and drawings are exemplary and illustrate preferred embodiments that achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A pixel cell comprising:
   a photo-conversion device at a surface of a substrate;
   a plurality of transistors, each comprising a gate and a source/drain region;
   a first dielectric material in contact with a surface of the photo-conversion device and the source/drain regions, the first dielectric material comprising tetraethyl orthosilicate, wherein a portion of the first dielectric material over the photo-conversion device is thicker than a portion of the first dielectric material over and in contact with the source/drain regions;
   the first dielectric material having an opening over a portion of one of the source/drain regions;
   at least one conductor through the opening and in direct contact with at least one of the source/drain regions underneath the opening, wherein the at least one conductor comprises a polysilicon comprising material;
   a conductive material over and in contact with the polysilicon comprising material, the conductive material comprising at least one of a silicide and a refractory metal;
   a second dielectric material in contact with the first dielectric material, the second dielectric material comprising at least one of borophosphosilicate glass, silicon dioxide, borosilicate glass, or phosphosilicate glass; and
   a third dielectric material in contact with the second dielectric material, the third dielectric material comprising at least one of borophosphosilicate glass, silicon dioxide, borosilicate glass, or phosphosilicate glass.

2. The pixel cell of claim 1, wherein the conductive material comprises a silicide.

3. The pixel cell of claim 2, wherein the silicide is selected from the group consisting of tungsten silicide, titanium silicide, cobalt silicide, molybdenum silicide, and tantalum silicide.

4. The pixel cell of claim 1, wherein the conductive material comprises a barrier metal/refractory metal layer.

5. The pixel cell of claim 4, wherein the conductive material comprises a tungsten nitride/tungsten layer.

6. The pixel cell of claim 4, wherein the conductive material comprises a titanium nitride/tungsten layer.

7. The pixel cell of claim 1, wherein the conductive material comprises a tungsten nitride layer.

8. The pixel cell of claim 1, wherein the polysilicon comprising material has a top surface on a same plane as a top surface of at least one of the dielectric materials.

9. The pixel cell of claim 1, wherein a top surface of the polysilicon comprising material is over a top surface of at least one of the dielectric materials.

10. The pixel cell of claim 1:
    further comprising a plurality of openings in the first and second dielectric materials over each of the source/drain regions; and a plurality of conductors, each conductor being in contact with a respective source/drain region through a respective opening.

11. The pixel cell of claim 1, wherein the conductor extends into a top portion of at least one of the source/drain regions.

12. The pixel cell of claim 1, wherein a top end of the conductor extends beyond the opening in a direction parallel to the substrate.

13. A pixel cell comprising:
a photo-conversion device at a surface of a substrate;
a plurality of transistors, each comprising a gate and a floating diffusion region;
a first dielectric material over and in contact with a surface of the photo-conversion device and the floating diffusion regions, the first dielectric material comprising tetraethyl orthosilicate, wherein a portion of the first dielectric material over and in contact with the photo-conversion device is thicker than a portion of the first dielectric material over and in contact with the floating diffusion regions;
the first dielectric material having an opening over a portion of one of the floating diffusion regions;
at least one conductor through the opening and in direct contact with at least one of the floating diffusion regions, wherein the at least one conductor comprises a polysilicon material;
a conductive material over and in contact with the polysilicon material, the conductive material comprising at least one of a silicide and a refractory metal; and
a second dielectric material covering the conductive material, the second dielectric material comprising at least one of borophosphosilicate glass, silicon dioxide, borosilicate glass, or phosphosilicate glass.

14. A pixel cell comprising:
a photo-conversion device at a surface of a substrate;
a plurality of transistors, each comprising a gate and a source/drain region;
a first dielectric having two parts, a first part which is over the gate, over and in contact with the photo-conversion device, and over and in contact with at least one source/drain region, and a second part which is only over that portion of the first part which is over and in contact with the photo-conversion device;
a second dielectric in contact with the first dielectric;
the first and second dielectrics having an opening over the at least one source/drain region; and
at least one conductive plug provided in the opening and in contact with the at least one source/drain region.

15. The pixel cell of claim 14, wherein the first part of the first dielectric and the second part of the first dielectric comprise different materials.

16. The pixel cell of claim 14, further comprising a third dielectric in contact with the second dielectric.

17. The pixel cell of claim 14, wherein the first dielectric comprises tetraethyl orthosilicate, silicon dioxide, silicon nitride, or oxynitride.

18. The pixel cell of claim 14, further comprising a conductive material over and in contact with the at least one conductive plug.

19. The pixel cell of claim 14, wherein the at least one conductive plug has a top surface on a same plane as a top surface of at least one of the dielectrics.

20. The pixel cell of claim 14, wherein the at least one conductive plug has a top surface that is above a top surface of at least one of the dielectrics.

* * * * *